United States Patent
Nguyen et al.

(10) Patent No.: US 6,544,885 B1
(45) Date of Patent: Apr. 8, 2003

(54) POLISHED HARD MASK PROCESS FOR CONDUCTOR LAYER PATTERNING

(75) Inventors: Khanh B. Nguyen, Sunnyvale, CA (US); Harry J. Levinson, Saratoga, CA (US); Christopher F. Lyons, Fremont, CA (US); Scott A. Bell, San Jose, CA (US); Fei Wang, San Jose, CA (US); Chih Yuh Yang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 128 days.

(21) Appl. No.: 09/706,498

(22) Filed: Nov. 3, 2000

Related U.S. Application Data

(60) Provisional application No. 60/202,853, filed on May 8, 2000.

(51) Int. Cl.[7] .............................................. H01L 23/58
(52) U.S. Cl. ........................ 438/631; 438/950; 438/717
(58) Field of Search ................................ 438/631, 626, 438/633, 645, 669, 671, 584, 597, 689, 691, 692, 717, 736, 942, 950

(56) References Cited

U.S. PATENT DOCUMENTS

| | | | |
|---|---|---|---|
| 4,478,679 A | | 10/1984 | Chang et al. |
| 5,741,741 A | | 4/1998 | Tseng |
| 5,759,906 A | * | 6/1998 | Lou ............................. 438/623 |
| 5,821,169 A | | 10/1998 | Nguyen et al. |
| 5,893,748 A | | 4/1999 | Lin |
| 5,953,577 A | * | 9/1999 | Huggins ........................ 438/4 |
| 5,985,761 A | * | 11/1999 | Sparks et al. ................ 438/669 |
| 6,261,923 B1 | * | 7/2001 | Kuo et al. ................... 438/427 |
| 6,306,560 B1 | * | 10/2001 | Wang et al. ................. 430/313 |

* cited by examiner

*Primary Examiner*—Richard Elms
*Assistant Examiner*—Brad Smith
(74) *Attorney, Agent, or Firm*—Renner, Otto, Boisselle & Sklar, LLP

(57) ABSTRACT

A method of forming a conductor pattern on a base with uneven topography includes placing conductor material on the base, placing a hard mask material on the conductor material, planarizing an exposed surface of the hard mask material, and placing a layer of resist on the hard mask material. The resist is patterned and the patterned resist is used in selectively etching the hard mask material, with the hard mask material used in selectively etching the underlying conductor material. By planarizing the hard mask material prior to placing a layer of resist thereupon, uniformity of the resist coating is enhanced and depth of focus problems in exposing the resist are reduced.

21 Claims, 4 Drawing Sheets

POLISHED HARD MASK PROCESS FOR CONDUCTOR LAYER PATTERNING

This application claims the benefit of U.S. Provisional Application No. 60/202,853, filed May 8, 2000.

BACKGROUND OF THE INVENTION

1. Field of the Invention

The present invention relates to the general field of methods for making metal interconnections for integrated circuits on semiconductor substrates, and more particularly relates to methods for forming metal interconnections on topographically uneven substrates or bases.

2. Description of The Prior Art

Integrated circuits formed on semiconductor substrates often require multiple levels of metal interconnections for electrically interconnecting electronic devices on semiconductor chips. As multiple layers of the metallic connections are built up, the topography of the semiconductor chip becomes uneven, resulting in an irregular or substantially non-planar surface for laying down subsequent metallic layers. Such topographical irregularities lead to photoresist being placed on the surface at different heights. This increases difficulties in exposing the photoresist because having the photoresist at different elevations makes it difficult to properly focus exposure light from a light source on the photoresist for accurate exposure in a photolithography process. In addition, linewidth variations may result, from well known standing wave effects. For photolithographic processes which require a shallow depth of focus during exposure of the photoresist, unwanted distortions of photoresist images may occur when the photoresist is exposed over the uneven topography. In addition, problems associated with the uneven topography are exacerbated as thinner layers of photoresist are used. Such thinner layers of photoresist have been proposed as part of photolithography systems involving exposure by light having wavelengths from 11 nm to 14 nm, or by light from $F_2$ exposure by light having wavelengths from 11 nm to 14 nm, or by light from $F_2$ excimer lasers having wavelengths of approximately 157 nm, for example. Uneven distributions of photoresist due to the irregular surface topography lead to poor performance of the photoresist because the shorter-wavelength light used to expose the thin photoresist does not penetrate the photoresist as well as longer-wavelength light. Therefore, the uniformity of photoresist thickness takes on added importance when shorter-wavelength light is used for exposure.

Intervening layers of material have been used between the conducting material and the photoresist in part to reduce the effects of the uneven topography and in part for their usefulness in the etching process of the underlying metallic layer. However, such layers do not eliminate the problem of uneven topography, but at best merely reduce it to some degree.

Another approach to circumventing topographic problems has been to provide essentially planar insulating layers on which each layer of metal is then deposited. Such methods, however, have the disadvantage of requiring complex series of steps that include planarizing the insulating layer, planarizing the metal surface, and using metal plugs to fill in contact openings in the thick insulating layers of the resulting structure.

Another prior method for partially overcoming the problems of uneven topography are known as multilayered resist (MLR) processes. In MLR processes, an organic resist layer is first spun onto the wafer, thicker than the unevenness of the underlying topography, to provide a surface which is smoother and more planar than the original topography. An optional intermediate oxide or other inorganic film may then be deposited on the thick resist layer. The oxide is used as an etch mask for the thick layer. Finally, a thin imaging resist layer is deposited on top of the planarized stack. MLR has the drawback of adding steps to the production process, thereby degrading productivity.

From the foregoing it will be appreciated that there is a need in the semiconductor industry for providing a simple method of addressing the problems associated with uneven topography due to deposit of multiple metallic layers.

SUMMARY OF THE INVENTION

A method of forming a conductor pattern on a base with uneven topography includes placing conductor material on the base, placing a hard mask material on the conductor material, planarizing an exposed surface of the hard mask material, and placing a layer of resist on the hard mask material. The resist is patterned and the patterned resist is used in selectively etching the hard mask material, with the hard mask material used in selectively etching the underlying conductor material. By planarizing the hard mask material prior to placing a layer of resist thereupon, uniformity of the resist coating is enhanced and depth of focus problems in exposing the resist are reduced.

According to an aspect of the invention a method of forming a conductor pattern on a substrate with uneven topography includes planarizing a surface of a hard mask material which overlies the conductor material.

According to another aspect of the invention, a method of forming a conductor pattern on a base with uneven topography includes the steps of: (1) depositing a hard mask layer on top of a conductor layer which is on the base; (2) planarizing a surface of the hard mask layer; (3) placing a layer of resist on the surface of the hard mask layer; (4) patterning a resist pattern onto the resist; and (5) patterning the conductor layer, using the resist pattern and the hard mask layer, to form the conductor pattern.

According to yet another aspect of the invention, a method of forming a conductor pattern on a base with uneven topography includes the steps of: (1) depositing a conductor layer on the base, the conductor layer having uneven topography corresponding to the uneven topography of the base; (2) depositing a hard mask layer on top of a conductor layer which is on the base, the hard mask layer having uneven topography corresponding to the uneven topography of the conductor layer; (3) planarizing a surface of the hard mask layer; (4) placing a layer of resist on the surface of the hard mask layer; (5) patterning a resist pattern onto the resist; and (6) patterning the conductor layer, using the resist pattern and the hard mask layer, to form the conductor pattern.

According to still another aspect of the invention, a method of forming a resist layer on an underlying layer includes the steps of planarizing the underlying layer, and coating the underlying layer with resist.

According to a further aspect of the invention, a method of forming a semiconductor device includes planarizing a surface upon which resist is to be deposited.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with: the drawings.

DETAILED DESCRIPTION OF THE INVENTION

Figure 1:
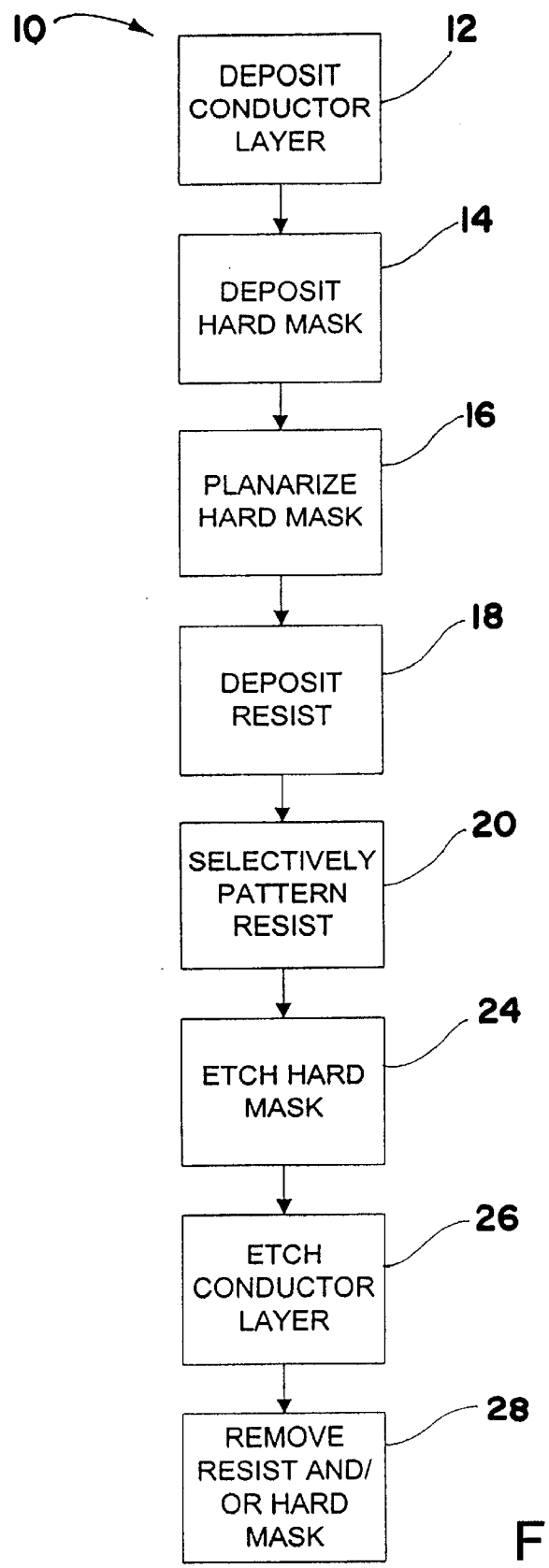
FIG. 1 is a flow chart illustrating a method of forming a conductor pattern on a substrate with uneven topography, in accordance with the present invention.
Figure 2:
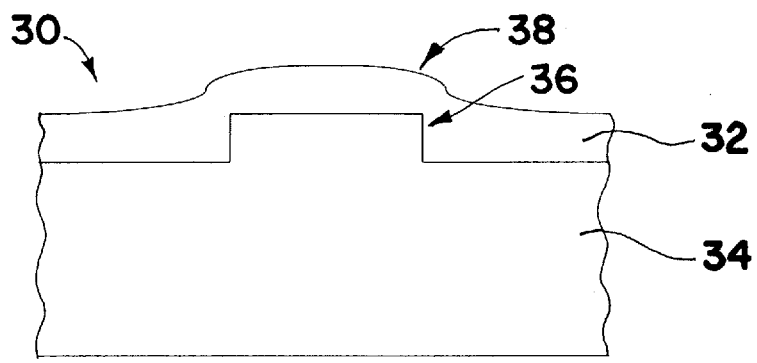
FIG. 2 is a schematic side view illustrating the step of the method of FIG. 1 of depositing a conductor layer.

Referring now to the figures, wherein like reference numerals indicate like parts, and initially to FIG. 1, a flow chart of a method 10 for forming a patterned conductor layer is shown. The method 10 initiates in step 12 with deposit of a conductor layer, using conventional well-known means, on a wafer, substrate or base with topography. Examples of methods to deposit a conductor layer include physical vapor deposition (sputtering), LPCVD (low pressure chemical vapor deposition (CVD)), PECVD (plasma enhanced CVD) and RTCVD (rapid thermal CVD). The step 12 is illustrated in FIG. 2 wherein a semiconductor device 30 has a conductor layer 32 atop a substrate, wafer or base 34 with topography such as a topographical feature 36. An exemplary topographical feature is a line of gate polysilicon. It will be appreciated that the use of the terms substrate, wafer, or base herein is meant to encompass semiconductor and/or insulator layers with or without electrical devices already having been built thereupon. The substrate may have an inter-level dielectric (ILD) layer thereupon to selectively electrically isolate previously constructed electronic devices or conductor layers from the conductor layer 32. The conductor layer 32 may be composed of one or more suitable materials such as polysilicon, amorphous silicon, aluminum, tungsten, tantalum, or molybdenum. The conductor layer 32 reduces somewhat the unevenness due to the topological feature 36, the corresponding portion of the conductor layer 32 being indicated at reference numeral 38.

Figure 3:
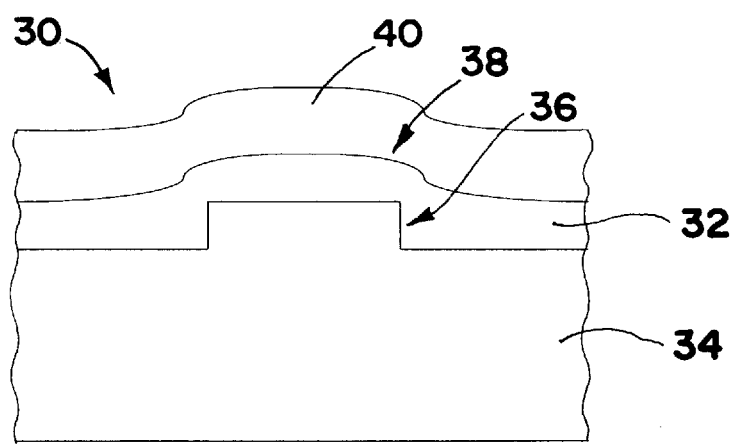
FIG. 3 is a schematic side view of the step of the method of FIG. 1 of depositing a hard mask.

Following deposit of the conductor layer 32 in step 12, a hard mask layer 40 is deposited on top of the conductor layer 32 in step 14, as illustrated in FIG. 3. The term "hard mask layer", as used herein, refers broadly to a non-photoresist layer that is used as an etch mask for an underlying layer. Preferably, the hard mask has a combination of the following characteristics: it is planarizable as described below, that is, its surface may be made planar such as by polishing or other means; and it has good etch selectivity in conjunction with the resist and the conductor materials utilized in the semiconductor 30. Suitable hard mask materials include $SiO_2$, SiON, $Si_3N_4$ and TiN. Examples of suitable methods for depositing the hard mask layer include LPCVD, PECVD and RTCVD.

Figure 4:
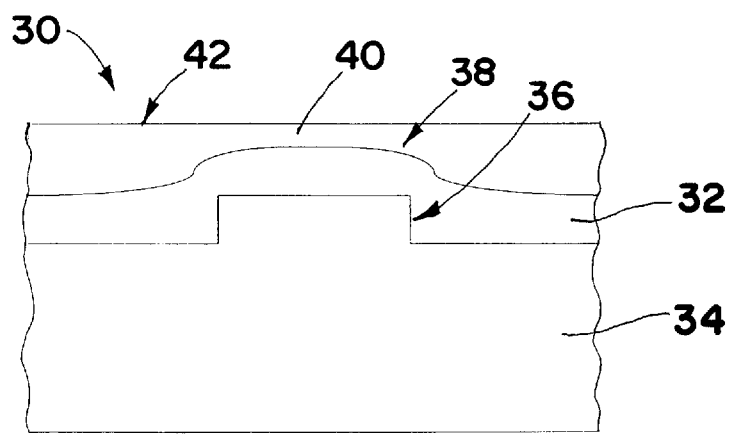
FIG. 4 is a schematic side view of the step of the method of FIG. 1 of planarizing the hard mask.

Next, the hard mask layer 40 is planarized in step 16 to form the hard mask planar surface 42 shown in FIG. 4. Planarization may be accomplished by polishing the surface of the hard mask 40, for example by using standard chemical/mechanical polishing (CMP) techniques. Such CMP processes may involve holding the semiconductor device against a rotating, wetted, polishing pad surface under controlled surface pressure. A polishing slurry, such as a mixture of either a basic or an acidic solution, may be used as a chemical etch component in combination with alumina or silica particles. A rotating polishing head or wafer carrier is generally used to hold the wafer under controlled pressure against a rotating polishing platen. The polishing platen is usually covered with a polishing pad, made from a material such as polyurethane. The CMP process employs both chemical and mechanical processes to remove unwanted material from the surface of the wafer. In such a process the liquid portion of the slurry chemically depletes, loosens, or modifies the composition of the material on the wafer which is to be removed. Then, the particles or grit within the slurry, in combination with the rotating polishing pad, physically remove the chemically modified material from the wafer.

The hard mask 40 has sufficient thickness to adequately cover topographical features such as the feature 36. The hard mask 40 allows enhanced selective etching of the underlying conductor layer 32. Thin layers of resist may engender problems when used as an etching mask to etch an underlying conductor layer or film. The thin resist may have insufficient thickness to provide the needed resistance to etching so as to fully protect the conductor layer throughout the etch of unprotected portions of the conductor layer. In other words, the same etch that provides the desired etching of portions of the conductor layer may also attack the photoresist layer, albeit to a lesser extent. A thin layer of resist may thus be unable to provide sufficient protection from etching for those portions of the conductor layer where etching is not desired. Therefore an intermediate layer, the hard mask layer 40, is provided between the resist and the conductor layer to give extra protection to those areas of the conducting layer where etching is not desired. The hard mask 40, being planarized, also provides a means for avoiding the problems caused by exposing a photoresist in a topographically uneven surface.

It will be appreciated that either positive or negative resists may be employed. Thus depending on the type of resist used the removed regions of the resist will be either the exposed or the unexposed portions of the resist.

Figure 5:
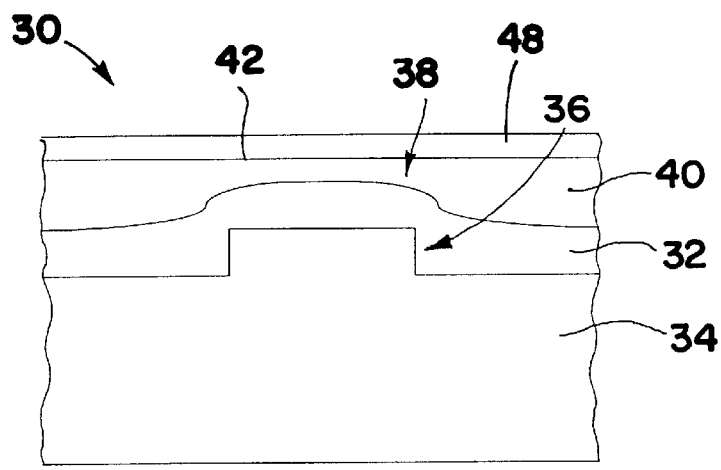
FIG. 5 is a schematic side view illustrating the step of the method of FIG. 1 of depositing a resist on the planarized hard mask.

In step 18, a layer of resist 48 is deposited upon the surface 42 of the hard mask 40, as is illustrated in FIG. 5. The resist is a radiation-sensitive film which is susceptible to a change in properties by exposure of it to a radiation source (providing radiation such as light, x-rays, or electrons). The resist may be a photoresist which is sensitive to light exposure. Preferably a photoresist susceptible to exposure by short-wavelength light (less than approximately 250 nanometers) is used. The photoresist may be susceptible to exposure by long or soft x-rays or extreme ultraviolet light (EUV) having a wavelength in the range of 5 to 70 nanometers, and preferably in the range of 10 to 14 nanometers. Alternatively, the resist may be susceptible to exposure by light having a somewhat longer wavelength, for example by light having a wavelength of about 193 or about 248 nanometers. The thickness of the resist layer is preferably less than 2,500 Angstroms and is more preferably between 1,000 and 2,000 Angstroms. Such a resist thickness allows substantially all of the incident exposure light to be absorbed within the resist film. A thinner resist is desirable because the shorter wavelength exposure light is quickly absorbed upon entering the resist. Therefore use of a thin resist allows exposure of the full depth of the resist. The optical properties of the hard mask may be optimized to provide anti-reflection capability when used with longer wavelength exposure (greater than or equal to 157 nm).

It will be appreciated that photoresists which absorb longer-wavelength radiation may be employed. For such photoresists it is preferable that the resist layer have a thickness sufficiently large so that substantially all of the incident exposure radiation is absorbed within the resist layer, thereby avoiding or minimizing the potential problem of nonuniform optical properties of the variable thickness hard mask layer affecting the exposure of the resist due to reflection of the radiation from the hard mask layer.

Thus, with use of thin resist films and lower-wavelength exposure radiation the intermediate hard mask layer does not function as an antireflection film. This is because most substrate materials reflect weakly for wavelengths less than about 20 nm. The nonuniformity of the hard mask thickness after polishing is therefore not a significant factor in the exposure of the overlying resist.

The resist layer 48 may be formed atop the surface 42 by placing liquid resist upon the surface and spinning the device 30 to spread the liquid resist thereupon. It will be appreciated that alternatively other methods may be used for placing the resist atop the hard mask.

Figure 6:
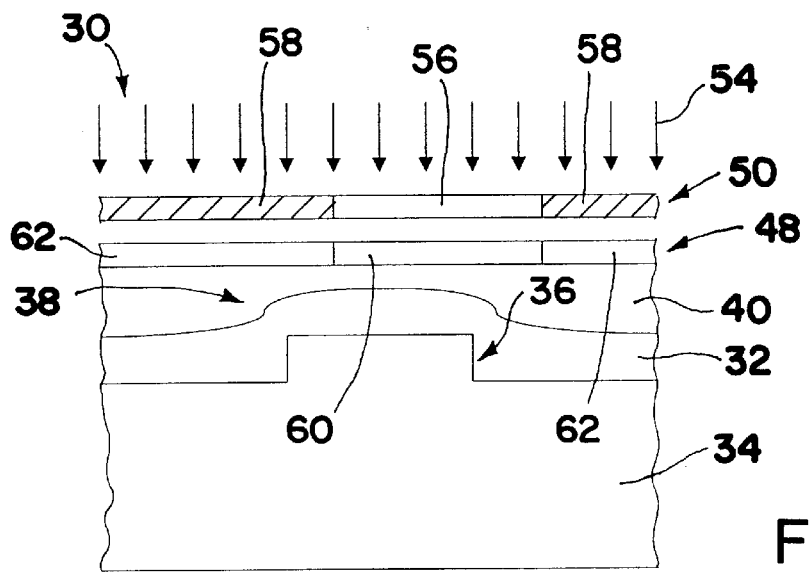
FIG. 6 is a schematic side view illustrating the step of the method of FIG. 1 of selectively patterning the resist.

Subsequently, the resist 48 is selectively patterned in step 20, the pattern corresponding to a desired pattern for the underlying conductor layer 32. The method employed in patterning the resist is dependent on the type of resist employed. For a photoresist, an exemplary method is shown in FIG. 6, wherein a mask 50 is interposed between the resist 48 and exposing light or other radiation 54, such from an exposure source and associated optics. For longer wavelengths (greater than or equal to about 157 nm) the mask 50 may have transmissive regions such as the region 56 which allow exposure radiation to pass therethrough, and opaque regions 58 which block transmission of the radiation. Exposed resist 60 in a region of the resist layer 48 corresponding to the transmissive region 56 is exposed by the light or other radiation 54. Resist in areas 62 corresponding to the opaque regions 58 of the mask 50 receive little or no radiation from the exposure source 54, and therefore are not exposed. Many such exposure methods and variations thereof are well known in the art. For example, for EUV exposures (using light having a wavelength of less than about 20 nm), the mask may consist of patterned absorbers on reflecting multilayers. Resist is not exposed in those areas corresponding to absorber on the mask.

The photoresist being at a uniform elevation with relation to the bottom of the device 30, for example, and having a uniform thickness, may be exposed without concern for the difficulties involved in the varying depth of focus required for exposing resist on a topographically uneven surface, and without concern for the difficulties of the varying thickness of a resist layer on a topographically uneven surface.

It will be appreciated that a wide variety of exposure sources may be employed depending on the type of resist utilized. As mentioned earlier, exposure sources may emit any of a variety of different types of radiation, such as visible or non-visible light waves, x-rays, electrons, or ions.

Figure 7:
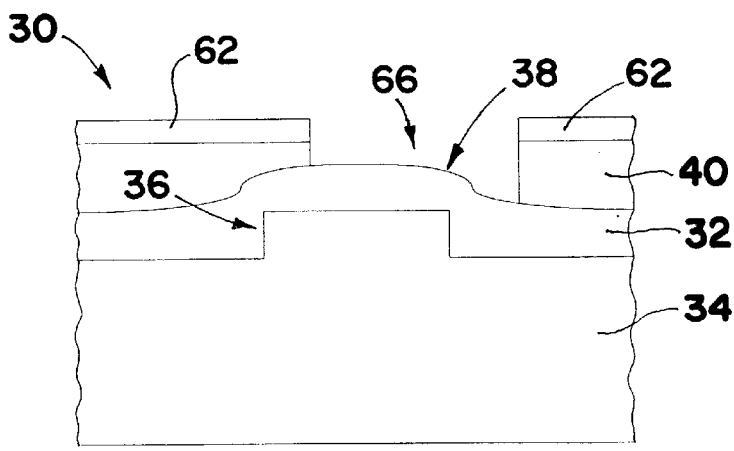
FIG. 7 is a schematic side view of a semiconductor device illustrating the step of the method of FIG. 1 of etching the hard mask.

In step 24, resist developer is used to remove the patterned resist, and the portion of the hard mask 40 previously covered by that resist is removed by etching. As shown in FIG. 7, the removed area 66 includes the exposed resist region 60 and the portion of the hard mask 40 underlying the exposed resist region 60. The etching may be done by a dry plasma process or a wet chemical process.

It will be appreciated that the etching process may include in whole or in part nonchemical methods of removing material, such as ion bombardment. The etching processes may alternatively or in addition include use of dry etching methods such as plasma etching. For example, a silicon nitride ($Si_3N_4$) may be selectively etched by plasma etching using sulfur hexafluoride ($SF_6$) gas.

The selectivity of the etchant material or etching process used will depend upon the specific chemistry and conditions used to etch the hard mask. Also, the etchant or removal method preferably do not etch the conductor material. Etching of the conductor material could result in the undesirable side effect of premature removal of portions of the conducting layer with possible consequent undesired removal of underlying layers.

Following the removal of the desired hard mask material, the remaining resist may be removed in a separate step, if desired. The method for such a step desirably selectively removes the resist material at a greater rate than the hard mask or the conductor.

Figure 8:
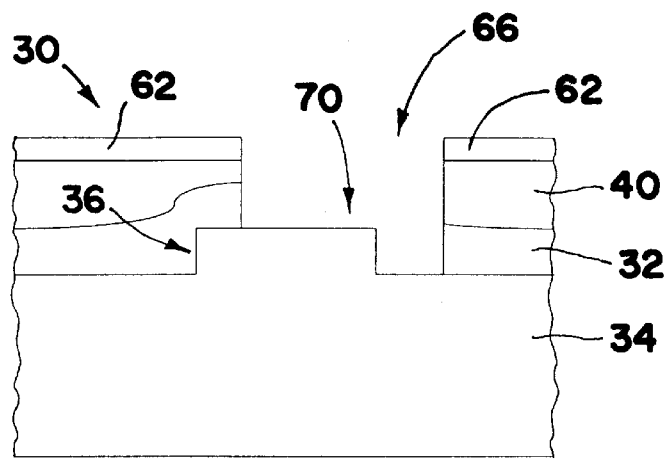
FIG. 8 is a schematic side view of a semiconductor device illustrating the step of the method of FIG. 1 of etching the conductor layer using the hard mask.

In step 26 the remaining hard mask is used in etching the underlying conductor 32. This etch may be performed by chemical and/or nonchemical means. An exemplary chemical etchant is a mixture of phosphoric, acetic and nitric acids, which is used to etch aluminum. Preferably the etchant is selective such that it removes the conductor material at a higher rate than the hard mask material. The results of such an etch are shown in FIG. 8, wherein a portion 70 of the conductor layer 32 has been removed, the portion 70 corresponding to the removed portion 66 of the hard mask 40.

Figure 9:
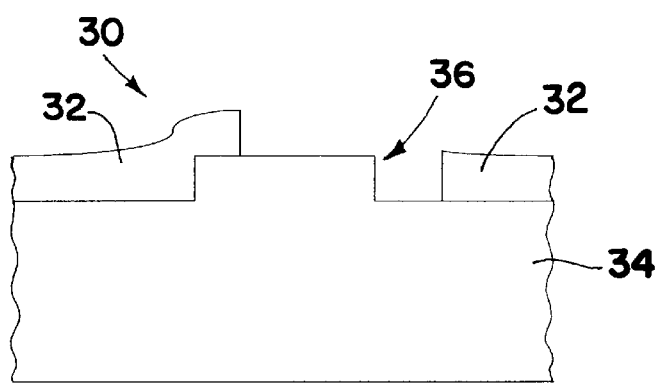
FIG. 9 is a schematic side view of a semiconductor device illustrating the step of the method of FIG. 1 of removing the hard mask.

It will be appreciated that following the etching of the conductor by use of the hard mask, the remaining resist and hard mask material may be removed in step 28 by a selective etch. FIG. 9 shows the semiconductor 30 after such a removal of the hard mask and the resist. The device is now ready for further processing, such as adding of additional layers of patterned conductor material.

Figure 10:
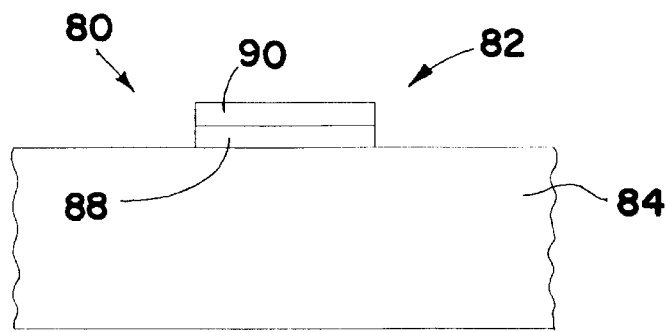
FIG. 10 is a side view showing a semiconductor device formed in accordance with the method of FIG. 1.

The method described above may be used in the fabrication of semiconductor devices which includes gates. For example, as illustrated in FIG. 10, the method may be used in fabrication of a semiconductor device 80 which includes a gate electrode 82 atop a substrate 84, with a gate oxide or dielectric layer 88 therebetween. The gate stack comprised of the gate electrode 82 and the oxide layer 88 acts as a topographical irregularity, complicating formation of subsequent interconnections. Thus metal oxide semiconductor field effect transistors (MOSFETs) may be advantageously interconnected as part of a semiconductor device using the method described above.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of forming a conductor pattern on a base with uneven topography, comprising:

depositing a hard mask layer on top of a conductor layer which is on the base;

planarizing a surface of the hard mask layer;

placing a layer of resist on the surface of the hard mask layer;

patterning a resist pattern onto the resist; and patterning the conductor layer, using the resist pattern and the hard mask layer, to form the conductor pattern.

2. The method of claim 1, wherein the depositing the hard mask layer includes depositing a hard mask material selected from a group consisting of $SiO_2$, SiON, $Si_3N_4$ and TiN.

3. The method of claim 1, wherein the placing a layer of resist includes placing a layer of resist that is between 1000 and 2000 Angstroms thick.

4. The method of claim 1, wherein the placing a layer of resist includes placing a layer of photoresist on the surface of the hard mask layer.

5. The method of claim 4, wherein the photoresist is susceptible to exposure by short wavelength radiation which has a wavelength of less than 250 nanometers.

6. The method of claim 1, wherein the planarizing includes polishing the surface of the hard mask layer.

7. The method of claim 6, wherein the polishing includes chemical/mechanical polishing.

8. The method of claim 1, wherein the patterning of the resist pattern includes exposing selected portions of the resist by exposure to radiation.

9. The method of claim 1, wherein the patterning the conductor layer includes etching the hard mask to form a hard mask pattern by use of the resist pattern, and etching the conductor layer to form the conductor pattern by use of the hard mask pattern.

10. The method of claim 1, wherein the patterning the conductor layer to form the conductor pattern includes forming gate conductors.

11. The method of claim 1, wherein the base with the uneven topography includes a gate electrode and a gate dielectric atop a substrate.

12. The method of claim 1, further comprising, after the patterning the conductive layer, removing the resist pattern and the hard mask layer.

13. A method of forming a conductor pattern on a base with uneven topography, comprising:

depositing a conductor layer on the base, the conductor layer having uneven topography corresponding to the uneven topography of the base;

depositing a hard mask layer on top of the conductor layer which is on the base, the hard mask layer having uneven topography corresponding to the uneven topography of the conductor layer;

planarizing a surface of the hard mask layer;

placing a layer of resist on the surface of the hard mask layer;

patterning a resist pattern onto the resist; and patterning the conductor layer, using the resist pattern and the hard mask layer, to form the conductor pattern.

14. The method of claim 13, wherein the depositing the hard mask layer includes depositing a hard mask material selected from a group consisting of $SiO_2$, SiON, $Si_3N_4$ and TiN.

15. The method of claim 13, wherein the placing a layer of resist includes placing a layer of resist that is between 1000 and 2000 Angstroms thick.

16. The method of claim 13, wherein the placing a layer of resist includes placing a layer of photoresist on the surface of the hard mask layer.

17. The method of claim 16, wherein the photoresist is susceptible to exposure by short wavelength radiation which has a wavelength of less than 250 nanometers.

18. The method of claim 13, wherein the planarizing includes polishing the surface of the hard mask layer.

19. The method of claim 13, wherein the base with the uneven topography includes a gate electrode and a gate dielectric atop a substrate.

20. The method of claim 13, further comprising, after the patterning the conductive layer, removing the resist pattern and the hard mask layer.

21. A method of forming a conductor pattern on a base with uneven topography, comprising:

depositing a conductor layer on the base, wherein the conductor layer has uneven topography corresponding to the uneven topography of the base;

depositing a hard mask layer on top of a conductor layer which is on the base, wherein the hard mask layer has uneven topography corresponding to the uneven topography of the conductor layer;

planarizing a surface of the hard mask layer by polishing the surface of the hard mask layer;

placing a layer of resist on the surface of the hard mask layer;

patterning a resist pattern onto the resist;

patterning the conductor layer, using the resist pattern and the hard mask layer, to form the conductor pattern; and after the patterning the conductive layer, removing the resist pattern and the hard mask layer;

wherein the base with the uneven topography includes a gate electrode and a gate dielectric atop a substrate.

* * * * *